(12) United States Patent
Park et al.

(10) Patent No.: US 7,535,761 B2
(45) Date of Patent: May 19, 2009

(54) FLASH MEMORY DEVICE CAPABLE OF PREVENTING COUPLING EFFECT AND PROGRAM METHOD THEREOF

(75) Inventors: Ki-Tae Park, Seongnam-si (KR); Yeong-Taek Lee, Seoul (KR); Ki-Nam Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 189 days.

(21) Appl. No.: 11/637,415

(22) Filed: Dec. 12, 2006

(65) Prior Publication Data

US 2008/0094901 A1  Apr. 24, 2008

(30) Foreign Application Priority Data

Oct. 20, 2006  (KR)  ................. 10-2006-0102385

(51) Int. Cl.
*G11C 11/34* (2006.01)
(52) U.S. Cl. ................. 365/185.12; 365/185.11; 365/230.03
(58) Field of Classification Search ............ 365/185.12, 365/185.11, 230.03
See application file for complete search history.

(56) References Cited

U.S. PATENT DOCUMENTS

| | | | |
|---|---|---|---|
| 5,867,429 A | 2/1999 | Chen et al. | |
| 6,469,955 B1 | 10/2002 | Tsao et al. | |
| 6,704,239 B2 | 3/2004 | Cho et al. | |
| 6,775,185 B2 * | 8/2004 | Fujisawa et al. | 365/185.11 |
| 6,813,214 B2 | 11/2004 | Cho et al. | |
| 7,221,587 B2 | 5/2007 | Yamashita et al. | |
| 7,239,556 B2 * | 7/2007 | Abe et al. | 365/185.33 |
| 7,257,027 B2 | 8/2007 | Park | |
| 7,307,878 B1 * | 12/2007 | Lee et al. | 365/185.03 |
| 2003/0021172 A1 | 1/2003 | Cho et al. | |
| 2004/0085831 A1 | 5/2004 | Cho et al. | |
| 2005/0254329 A1 | 11/2005 | Yamashita et al. | |
| 2007/0002621 A1 | 1/2007 | Park | |

FOREIGN PATENT DOCUMENTS

| | | |
|---|---|---|
| JP | 11-176177 | 7/1999 |
| KR | 1019950004854 B1 | 5/1995 |
| KR | 2003-0006519 | 1/2003 |
| KR | 1020060055271 A | 5/2006 |
| KR | 1020070002344 A | 1/2007 |
| WO | 2005109441 A1 | 11/2005 |

* cited by examiner

*Primary Examiner*—Son Dinh
*Assistant Examiner*—Nam Nguyen
(74) *Attorney, Agent, or Firm*—Mills & Onello, LLP

(57) ABSTRACT

The present invention provides a flash memory device that includes a word line; even page cells that are physically adjacent and connected to the word line; and odd page cells that are physically adjacent and connected to the word line, wherein at a program operation, page data is programmed in either one of the even page cells or the odd page cells.

24 Claims, 10 Drawing Sheets

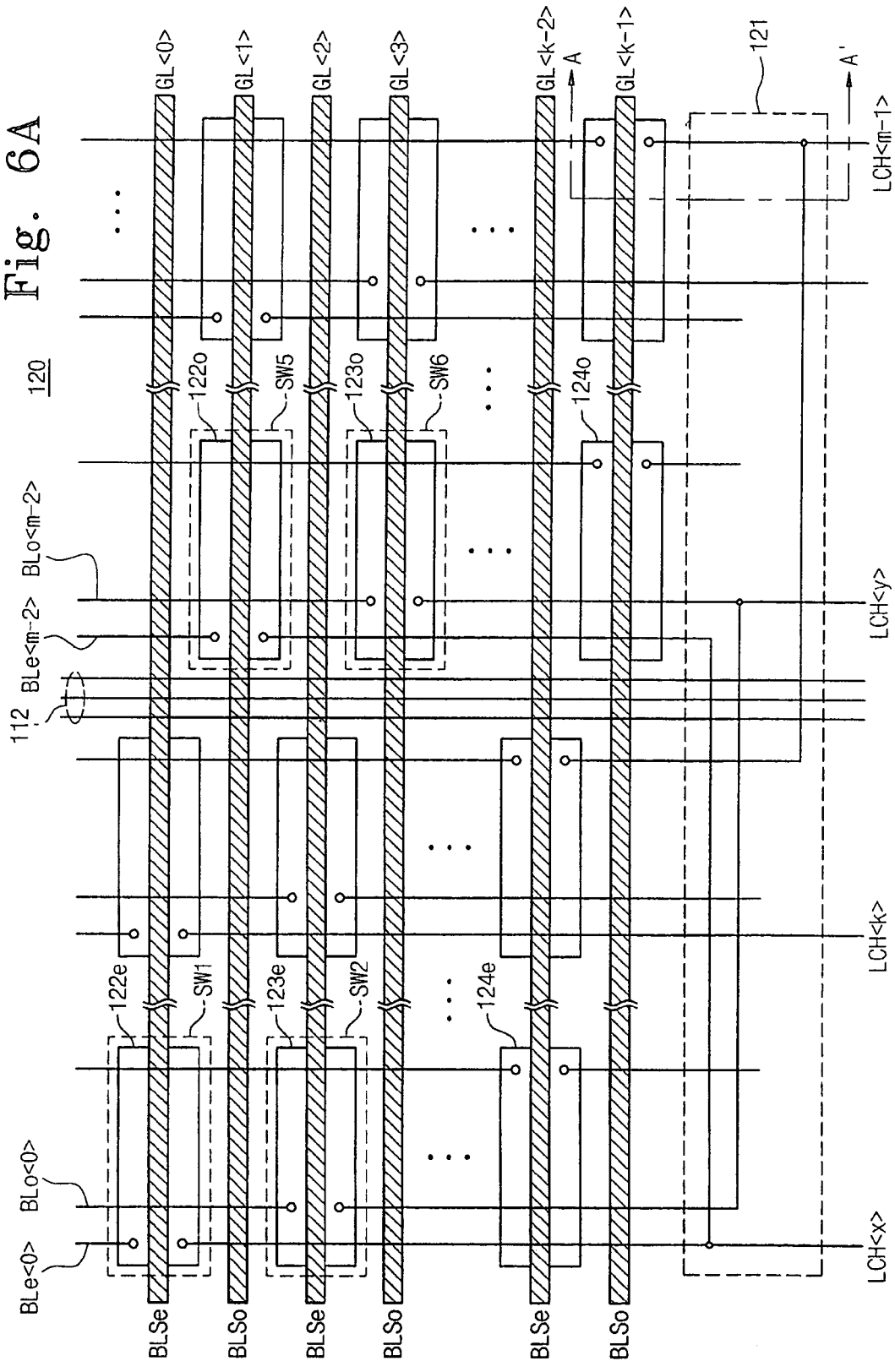

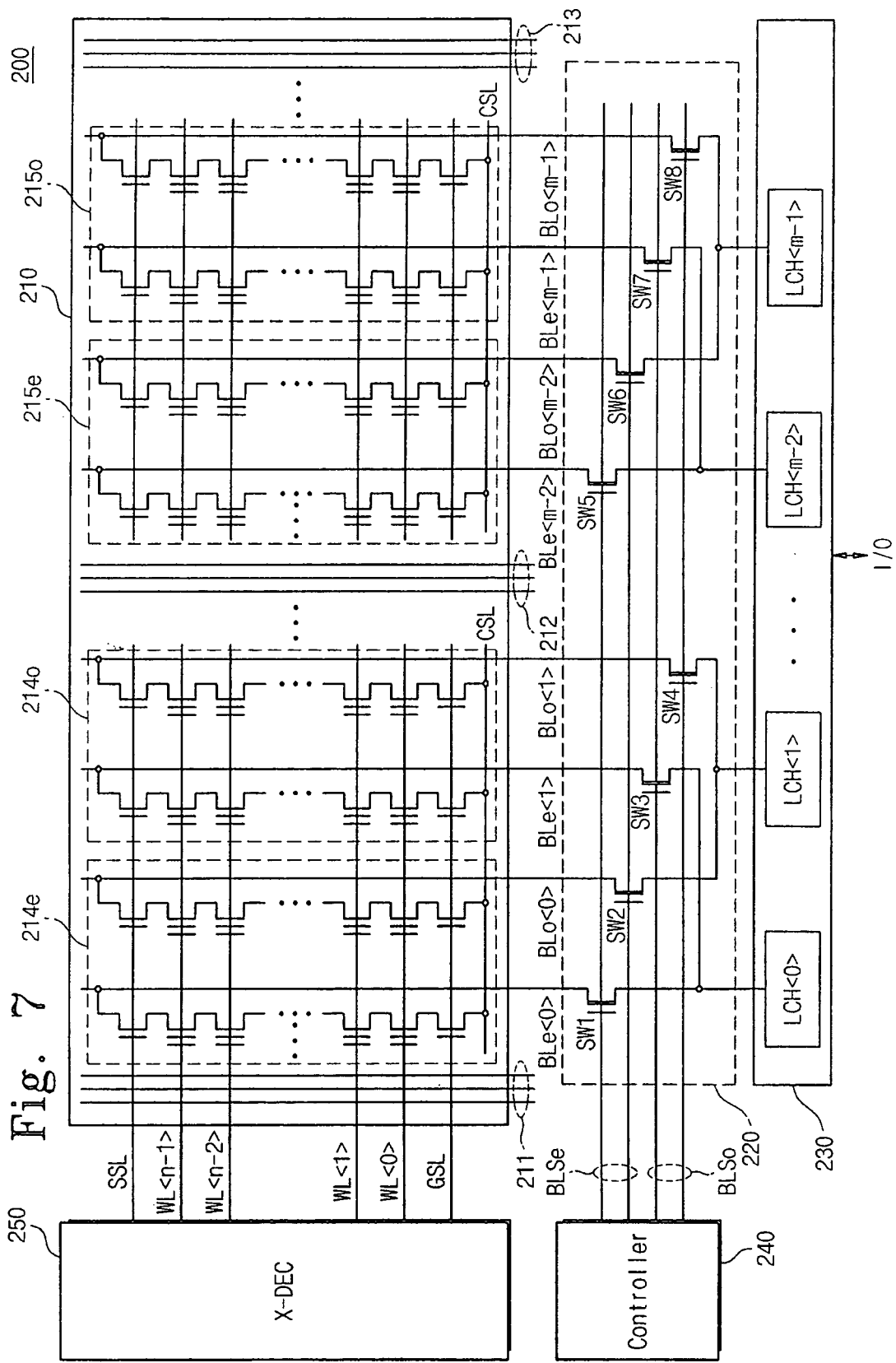

FLASH MEMORY DEVICE CAPABLE OF PREVENTING COUPLING EFFECT AND PROGRAM METHOD THEREOF

CROSS-REFERENCE TO RELATED APPLICATIONS

This U.S. non-provisional patent application claims priority under 35 U.S.C. §119 to Korean Patent Application 10-2006-0102385, filed on Oct. 20, 2006 in the Korean Intellectual Property Office, the entire contents of which are hereby incorporated by reference.

BACKGROUND OF THE INVENTION

The present invention relates to a semiconductor memory device and, more particularly, to a flash memory device capable of reducing coupling caused between adjacent memory cells in the same row.

In recent years, application of storage devices such as volatile memories and non-volatile memories are rapidly spread into mobile devices such as MP3 players, portable media players (PMPs), cellular phones, notebook computers, personal digital assistants (PDAs), and the like. Such mobile devices necessitate mass storage devices to provide various functions (e.g., moving figure reproducing function). Many efforts have been made to satisfy such needs. As one of such efforts, a multi-bit memory device has been proposed which stores 2-bit data or more per cell. Below, a memory cell storing multi-bit data is called an MLC. And, the mass storage devices can be implemented to integrate more memory cells per unit area, according to advances in process technologies.

FIG. 1 is a diagram showing a conventional flash memory device. A conventional flash memory device includes a cell array 10, a bit line selector circuit 20, and a page buffer circuit 30. Memory cells constitute a page unit that share a word line (WL). Alternatively, memory cells constitute a string unit serially connected with respect to a bit line. A plurality of string units constitutes a block, which comprises a basic erase unit.

The bit line selector circuit 20 selects either even-numbered bit lines BLe<X> or odd-number bit lines BLo<X> according to the control of a controller circuit 40. This bit line structure is used to reduce current noise that is made during a read operation. Accordingly, in order to read data from all memory cells connected to one word line, a bit line selecting operation for selecting even-numbered bit lines and odd-numbered bit lines through the bit line selector circuit 20 has to be carried out twice. This switching operation is not limited to the read operation. For example, during a program operation, an even page and an odd page are individually selected and programmed sequentially. Switches SW1-SW8 of the bit line selector circuit 20 are each formed of a high-voltage switch.

The page buffer circuit 30 operates as a write driver for a program operation and as a sense amplifier for a read operation. During the program operation, the page buffer circuit 30 supplies a pair of even-numbered and odd-numbered bit lines sequentially with a voltage corresponding to data. When programming an MLC, the page buffer circuit 30 provides LSB page data to respective bit lines and then MSB page data thereto. Accordingly, one latch is connected with a pair of even-numbered and odd-numbered bit lines.

The controller circuit 40 controls the bit line selector circuit 20 to select even-numbered or odd-numbered bit lines based on a column address. A row decoder circuit 50 controls connecting of memory cells to bit lines in response to a row address, and supplies a selected word line with a program voltage, a read voltage, and the like. The row decoder circuit 50 supplies a pass voltage to unselected word lines at a program operation so that connection between selected memory cells and bit lines is maintained.

FIG. 2 is a diagram showing a layout structure of a bit line selector circuit 20 illustrated in FIG. 1. Referring to FIG. 2, gate lines GLi(i=0, 2, . . . , (k-2)) for selecting even-numbered bit lines and gate lines GLj(j=1,3, . . . , (k-1)) for selecting odd-numbered bit lines are formed on a plurality of semiconductor active regions 21. Those skilled in the art will appreciate that switches are described by describing the active region 21. A bit line signal from a latch (e.g., LCH<0>) of a page buffer circuit 30 in FIG. 1 is provided to an even-numbered bit line BLe<0> or an odd-numbered bit line BLo<0> by control signals BLSe and BSLo transferred to the gate lines GL<0> and GL<1> that are formed on the active region 21. In the event that the control signal BLSe has a high level and the control signal BLSo has a low level, the bit line BLe<0> is selected. In the event that the control signal BLSe has a low level and the control signal BLSo has a high level, the bit line BLo<0> is selected. Bit line signals from the page buffer circuit 30 are in turn transferred to odd-numbered or even-numbered bit lines. That is, high-voltage switches (e.g., SW1 and SW2, refer to FIG. 1) are formed by the active region 21 and the gate lines GL<0> and GL<1>.

FIG. 3 is a diagram for describing the coupling caused between memory cells 14 sharing the same word line, in the event that the memory cells are programmed in a manner described in FIG. 2. Memory cells MC<0> and MC<2> are programmed when even-numbered bit lines are selected, and then a memory cell MC<1> is programmed to a specific state when an odd-numbered bit line is selected. The coupling effect can be caused through parasitic capacitance Cx between floating gates of adjacent memory cells MC<0> and MC<2> when the memory cell MC<1> is programmed. Accordingly, threshold voltages of the memory cells MC<0> and MC<2> become higher than a previously programmed threshold voltage.

Unintended programming is made at unselected memory cells due to the coupling effect that causes variation of a threshold voltage of a memory cell, which is called "program disturbance." A program disturbance problem of a flash memory device is disclosed in U.S. Pat. No. 5,867,429 entitled "HIGH DENSITY NON-VOLATILE FLASH MEMORY ADVERSE EFFECTS OF ELECTRIC FIELD COUPLING BETWEEN ADJACENT FLOATING GATES," hereinafter the "the '429 patent." In accordance with a program method disclosed in the '429 patent, a threshold voltage distribution is widened due to the coupling effect, so that a margin between threshold voltage distributions is reduced. However, the '429 patent necessitates an additional program operation for adjusting a threshold voltage distribution after performing a conventional program operation. As a result, a program time is increased and complicated control is needed.

Accordingly, a technique is required which can block the coupling effect caused between memory cells, without requiring additional program operations.

SUMMARY OF THE INVENTION

In accordance with one aspect of the present invention, provided is a flash memory device that comprises a word line; even page cells that are physically adjacent and connected to the word line; odd page cells that are physically adjacent and connected to the word line; and a bit line selector circuit configured to program page data to either one of the even page cells or the odd page cells.

The flash memory device can further comprise a page buffer circuit configured to supply the page data, wherein the bit line selector circuit can be configured to supply the page data in the page buffer circuit to bit lines connected to the even page cells or to bit lines connected to the odd page cells.

The page buffer circuit can be further configured to apply a program inhibit voltage to the bit lines of an unselected one of the even page cells or the odd page cells, wherein unselected page cells are those page cells not being programmed with program data.

In accordance with another aspect of the invention, provided is a flash memory device comprising: a cell array including an even page region having at least two adjacent memory cells connected to a word line and an odd page region having at least two adjacent memory cells connected to the word line; a page buffer circuit configured to supply page data to the cell array; and a bit line selector circuit disposed between the page buffer circuit and the cell array, and configured to transfer the page data to bit lines in either one of the even page region or the odd page region in a program operation.

The bit line selector circuit can be further configured to alternate the transfer of the page data between the even page region and the odd page region.

The flash memory device can further comprise a controller circuit configured to generate a first select signal to select bit lines in the even page region or a second select signal to select the bit lines in the odd page region, in response to a column address.

The bit line selector circuit can comprise: a first switch configured to transfer the page data to bit lines connected to the even page region in response to the first select signal; and a second switch configured to transfer the page data to bit lines connected to the odd page region in response to the second select signal.

The page buffer circuit can be configured to provide a program inhibit voltage to bit lines connected to the odd page region in response to the first select signal and to bit lines connected to the even page region in response to the second select signal.

The bit line selector circuit can comprise: first and second even gate lines for transferring the first select signal; first and second odd gate lines for transferring the second select signal; a first active region formed at a lower side of the first even gate line, connected to a bit line of a first memory cell of the even page cells, and having a contact connected with an connection line from a first latch of the page buffer circuit; a second active region formed at a lower side of the second even gate line and connected with a bit line of a second memory cell adjacent to the first memory cell; a third active region formed at a lower side of the first odd gate line and connected with a bit line of a third memory cell of the odd page cells; and a fourth active region formed at a lower side of the second odd gate line, connected to a bit line of a fourth memory cell adjacent to the third memory cell, and having a contact connected with an connection line from a second latch of the page buffer circuit, wherein the connection line from the first latch is connected to the third active region and the connection line from the second latch is connected to the second active region.

A connection between the connection line from the first latch and the third active region and a connection between the connection line from the second latch and the second active region can be formed on different layers from the bit lines and in metal lines perpendicular to the bit lines.

The first and second odd gate lines can be in an alternating arrangement between the first and second even gate lines.

The flash memory device can further comprise dummy bit lines formed between the first and second active regions and the third and fourth active regions, formed on an upper side of the gate lines, and biased with a ground voltage.

The bit line selector circuit can comprise: a first connection line from a first latch of the page buffer circuit; a second connection line from a second latch of the page buffer circuit; a first active region connected with the first connection line via a first contact, with the second connection line via a second contact, and with bit lines of first and second memory cells, placed adjacently to each other, in the even page region via third and fourth contacts; a second active region connected with the first connection line via a fifth contact, with the second connection line via a sixth contact, and with bit lines of first and second memory cells, placed adjacently to each other, in the odd page region via seventh and eighth contacts; first and second even gate lines formed between the first contact and the third contact and between the second contact and the fourth contact and formed on the first active region; first and second odd gate lines formed between the fifth contact and the seventh contact and between the sixth contact and the eighth contact and formed on the second active region; and a plurality of dummy gate lines formed-on the first and second active regions, formed in turn between the first and second even gate lines and the first and second odd gate lines, and biased with a ground voltage.

The flash memory device can further comprise dummy gate lines formed between the first active region and the second active region, and biased with a ground voltage.

The flash memory device can further comprise metal lines formed between the first connection line and the fifth contact and between the second connection line and the second contact, and formed in a different layer from the bit lines and perpendicular to the bit lines.

The flash memory device can further comprise dummy bit lines formed between the even page region and the odd page region and biased with a ground voltage.

The memory cells in the even and odd page regions can be NAND flash memory cells.

In accordance with another aspect of the invention, provided is a method of programming a flash memory device that comprises memory cells connected to a word line, the method comprising: storing page data in a page buffer circuit; supplying the page data to bit lines of even page cells that are physically adjacent or to bit lines of odd page cells that are physically adjacent, in response to a column address; and applying a program voltage to the word line.

The method can further comprise applying a program-inhibit voltage to unselected bit lines of the even page cells or of the odd page cells, wherein unselected page cells are those page cells not being programmed with program data.

In accordance with another aspect of the invention, provided is a method of programming a flash memory device that comprises memory cells connected to a word line, the method comprising: storing page data in a page buffer circuit; supplying the page data to an even page region having two memory cells that are physically adjacent or to an odd page region having two memory cells that are physically adjacent, in response to a column address; and applying a program voltage to the word line.

The method can further comprise applying a program-inhibit voltage to the bit lines connected to the even or odd page region to which no page data is supplied.

The memory cells can include a plurality of even page cells and a plurality of odd page cells that are alternately disposed.

BRIEF DESCRIPTION OF THE DRAWINGS

Various aspects of the invention will become more apparent in view of the attached drawing figures, which are provided by way of example, not by way of limitation, wherein like elements are represented by like reference numerals, which are given by way of illustration only and thus do not limit the example embodiments of the present invention, wherein:

FIG. 6A is a diagram showing an embodiment of an exemplary layout structure of the bit line selector circuit illustrated in FIG. 5.

FIG. 7 is a block diagram showing a second embodiment of a flash memory device according to an aspect of the present invention.

DETAILED DESCRIPTION OF PREFERRED EMBODIMENTS

Figure 1:
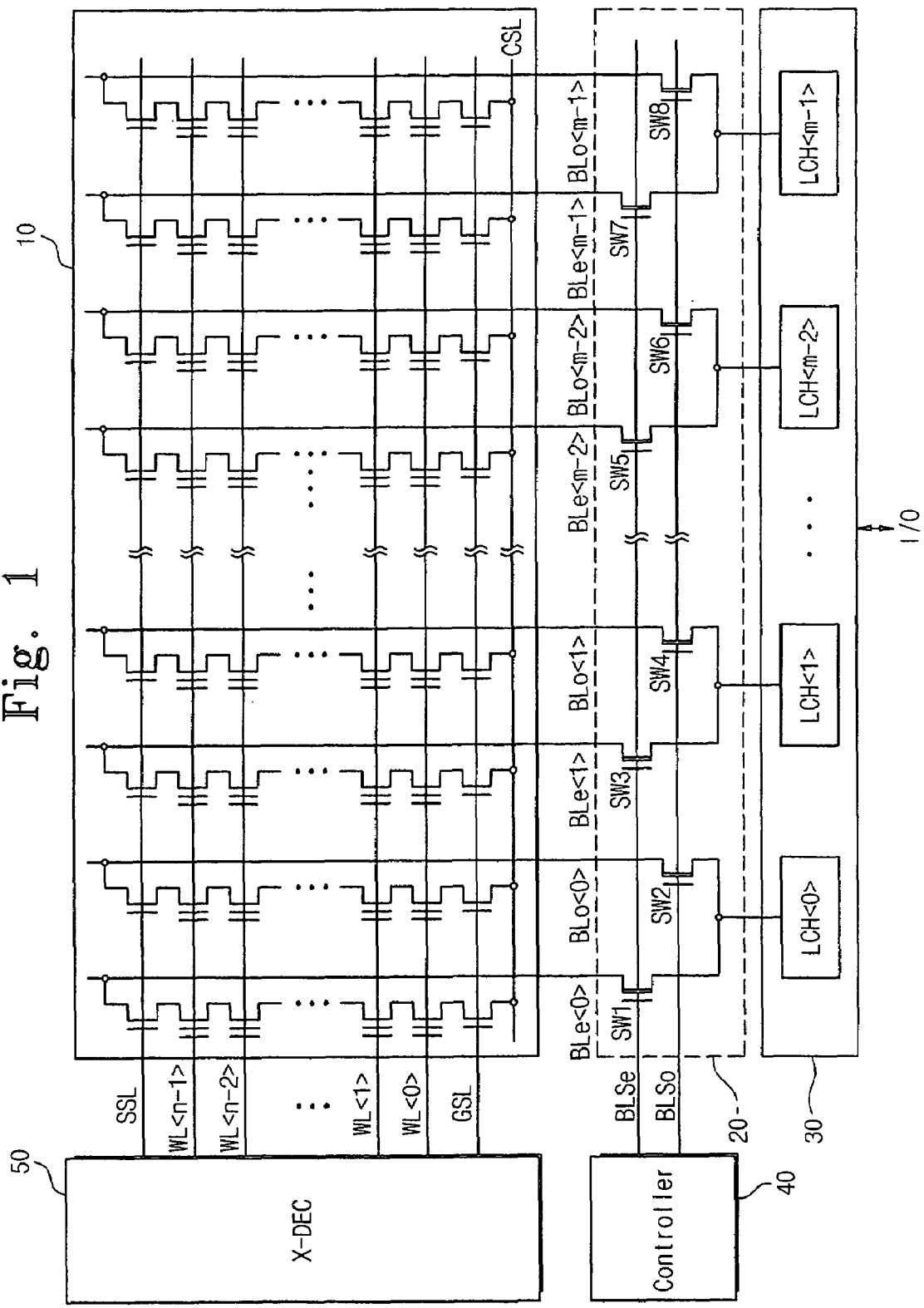
FIG. 1 is a diagram showing a conventional flash memory device.
Figure 2:
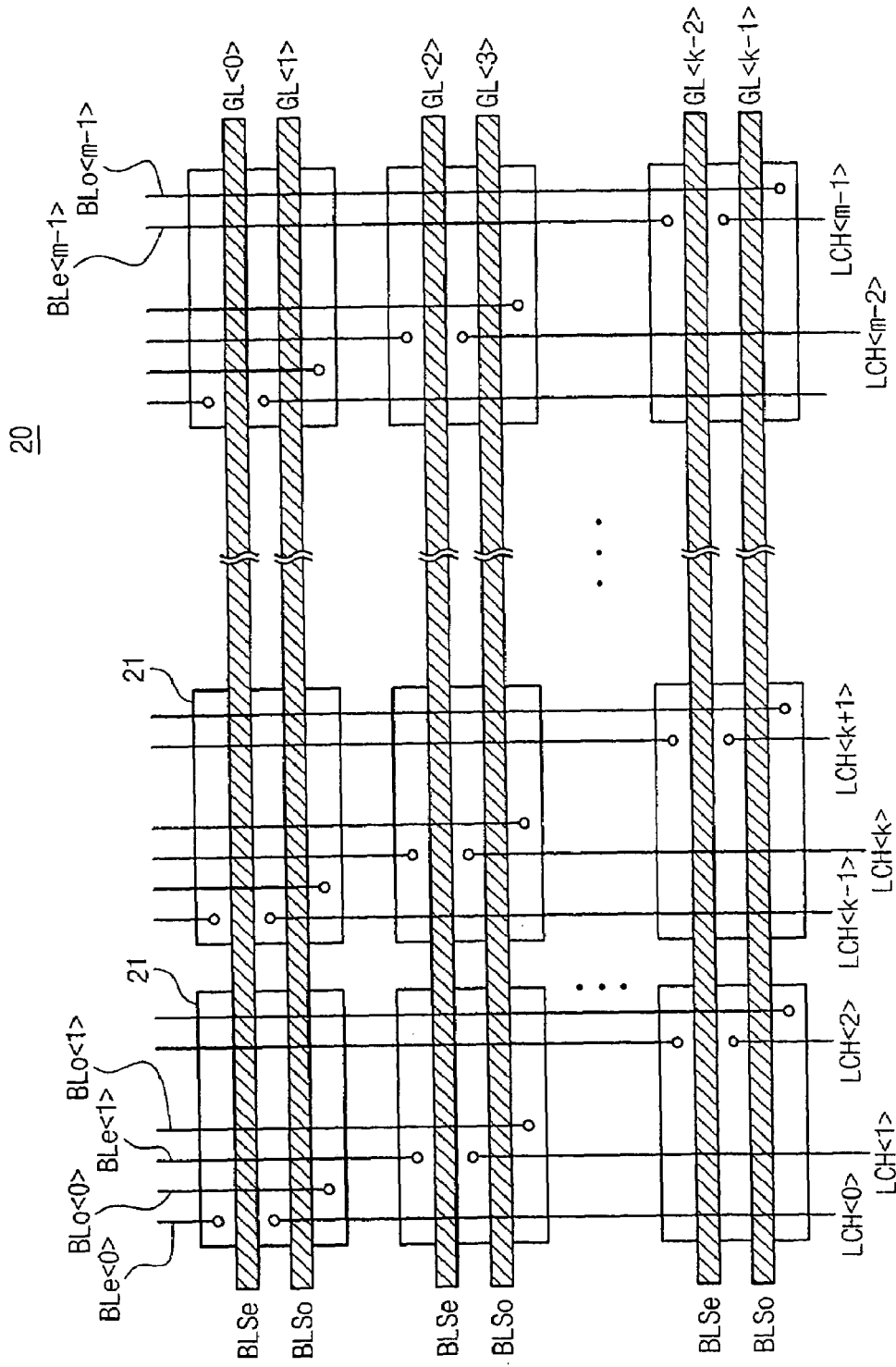
FIG. 2 is a diagram showing a layout structure of the bit line selector circuit illustrated in FIG. 1.
Figure 3:
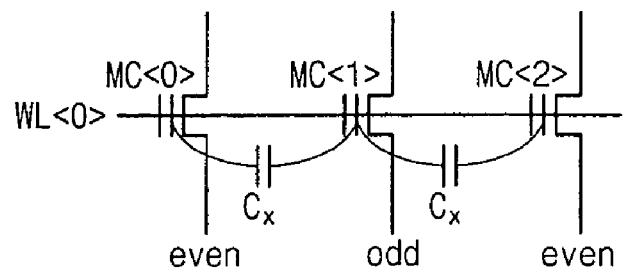
FIG. 3 is a diagram for describing the coupling in a conventional flash memory device caused between memory cells sharing the same word line in the event that memory cells are programmed in a manner described in FIG. 2.

The present invention will now be described more fully hereinafter with reference to the accompanying drawings, in which preferred embodiments of the invention are shown. This invention, however, can be embodied in many different forms and should not be construed as limited to the embodiments set forth herein. In the drawings, like numbers refer to like elements throughout.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. And, as used herein, the wording "and/or" includes each individual item listed and any combination of items.

It will also be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 4:
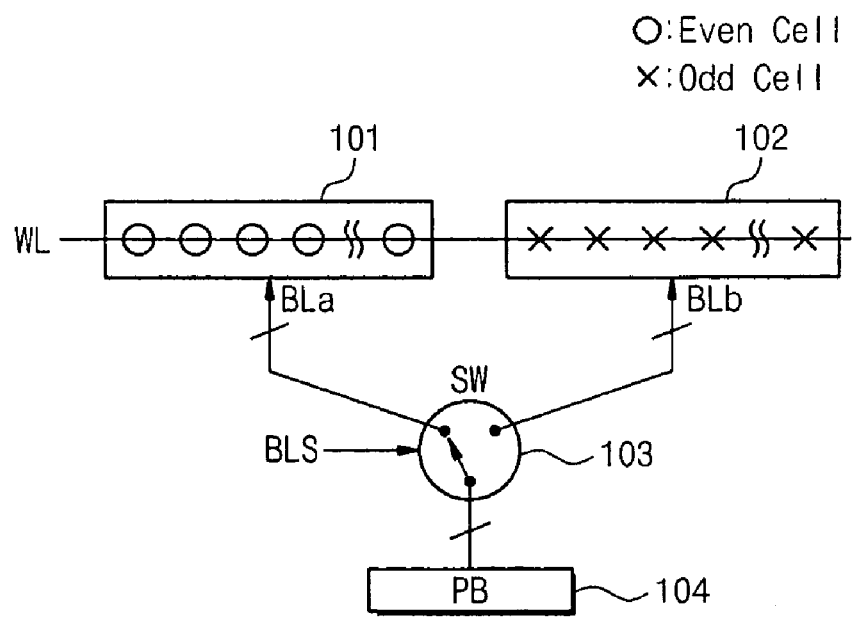
FIG. 4 is an illustrative diagram for describing a program operation according to aspects of the present invention.

FIG. 4 is an illustrative diagram for describing a program operation according to aspects of the present invention. Referring to FIG. 4, memory cells on the same word line WL are divided into an even page region 101 and an odd page region 102 configured to store even page data in even page cells and odd page data in odd page cells, respectively. The memory cells can be NAND flash memory cells, as one example.

In a program operation, program data is loaded into a page buffer (PB) 104. The page buffer 104 drives bit lines with a program or program inhibit voltage, according to the loaded data. A flash memory device according to the embodiment is configured such that page data is supplied to memory cells that are physically adjacent. In the event that even page data is programmed, a switch 103 transfers even page data in the page buffer 104 to bit lines BLa of the even page region 101 in response to a bit line select signal BLS. On the other hand, in the event that odd page data is programmed, the switch 103 transfers odd page data in the page buffer 104 to bit lines BLb of the odd page region 102 in response to the bit line select signal BLS. Although not shown in FIG. 4, bit lines of an unselected page region, i.e., either the even page region or the odd page region, can optionally be supplied with a program inhibit voltage.

Accordingly, while odd page data is programmed in memory cells of the odd page region 102, memory cells in the even page region 101 are not susceptible to the coupling effect.

Figure 5:
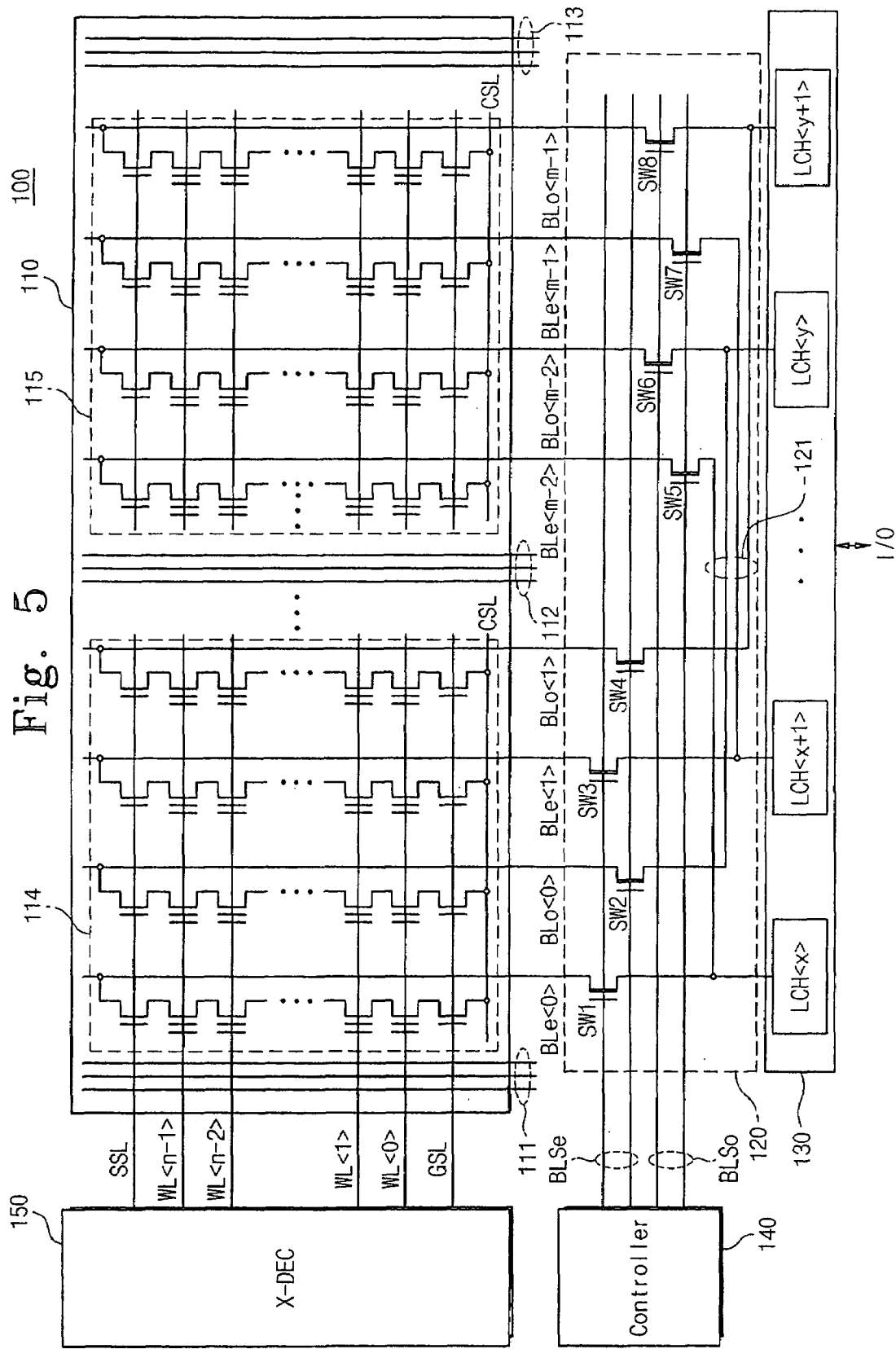
FIG. 5 is a circuit diagram showing a first embodiment of a flash memory device according to an aspect of the present invention.

FIG. 5 is a circuit diagram showing a first embodiment of a flash memory device according to an aspect of the present invention.

Referring to FIG. 5, there is illustrated a flash memory device 100 configured to block the coupling effect when even page data and odd page data are sequentially programmed at memory cells in the same word line. According to the first embodiment, a bit line selector circuit 120 is configured to transfer even page data and odd page data from a page buffer circuit 130 to cell regions that are not adjacent to each other. That is, unlike the prior art where even page data and odd page data are provided to cells being adjacent to each other, the bit line selector circuit 120 can provide even page data and odd page data to cells not adjacent to each other.

A cell array 110 can have the same function and structure as conventional memory cells. However, within the cell array odd page data and even page data are partitioned when stored, even though the memory cells are connected to the same word line by the bit line selector circuit 120, in a plurality of adjacent cell units. That is, even page data is stored in an even page region 114, while odd page data is stored in an odd page region 115. Dummy bit lines 112 are connected to a common source line CSL and are arranged between the even page region 114 and the odd page region 115, for isolation. As a result, no coupling effect between the regions 114 and 115 arises. Although the cell array is divided into two regions in this embodiment, that is, the even and odd regions 114 and 115, the present invention is not limited thereto. For example, even and odd page regions can be divided voluntarily on the basis of the dummy bit lines 111, 112 and 113. And, positions of the even and odd page regions 114 and 115 are selected only according to an operation of selecting even page data and odd page data through the bit line selector circuit 120, while a structure of the cell array 110 is not changed.

The bit line selector circuit 120 provides bit lines with signals corresponding to program data from the page buffer circuit 130 for a program operation. The bit line selector circuit 120 controls even page data and odd page data sequentially provided from the page buffer circuit 130 to be programmed in the even page region 114 and the odd page region 115, which are isolated each other. If even page data is received in the page buffer circuit 130, a controller circuit 140 activates a select signal BLSe. At this time, high-voltage switches SW1-SW4 of the bit line selector circuit 120 are turned on, and bit line signals corresponding to the even page data of the page buffer circuit 130 are transferred to bit lines BLe<0>, BLo<0>, BLe<1>, BLo<1> in the even page region 114 of the cell array 110. On the other hand, if odd page data is received in the page buffer circuit 130, the controller circuit 140 activates a select signal BLSo. At this time, high-voltage switches SW5-SW8 of the bit line selector circuit 120 are turned on, and bit line signals corresponding to the odd page data of the page buffer circuit 130 are transferred to bit lines BLe<m-2>, BLo<m-2>, BLe<m-1>, BLo<m-1> in the even page region 114 of the cell array 110.

For this selecting operation, there is needed an operation of sequentially switching into a bit line BLe<0> and a bit line BLo<m-2> bit line signals corresponding to respective even and odd page data provided from latches LCH<x> of the page buffer circuit 130. Accordingly, a bit line signal from the latch LCH<x> can be transferred to the high-voltage switches SW1 and SW5. Although not shown in FIG. 5, bit lines unselected by the high-voltage switches SW1-SW8 can be supplied with a program inhibit voltage. An interconnection can be formed for transferring a bit line signal of a latch LCH<x> to a bit line BLe<0> in the even page region 114, as will be appreciated by those skilled in the art. However, a conventional interconnection can be changed to form an interconnection with the high-voltage switch SW5 that is located relatively far from the latch LCH<x>. This will be described with reference to FIGS. 6A and 6B.

Continuously, the switches SW1-SW4 for providing bit line signals of the page buffer circuit 130 to bit lines in the even page region 114 are respectively connected with the switches SW5-SW8 for providing bit line signals of the page buffer circuit 130 to bit lines in the odd page region 115. With interconnection structures for this switch connection, it is possible to substantially interrupt the coupling between memory cells in the even page region 114 and memory cells in the odd page region 115 without changing the structure of the cell array 110.

The page buffer circuit 130 operates as a write driver in a program operation and as a sense amplifier in a read operation. In the program operation, the page buffer circuit 130 sequentially supplies bit line signals corresponding to data to odd-numbered and even-numbered bit lines. In case of MLC, LSB page data is provided to each bit line, and then MSB page data is provided thereto. Accordingly, one latch is connected with two even-numbered and odd-numbered bit lines. Herein, the controller circuit 140 and a row decoder circuit 150 are identical to those in FIG. 1, so description thereof is thus omitted.

In accordance with the embodiment of the bit line selector circuit 130, it is possible to interrupt the coupling effect between cells connected to the same word line by changing only a connection relationship between high-voltage switches in the bit line selector circuit 130. That is, when performing operations using connection lines 121 of the bit line selector circuit 120, it is possible to substantially interrupt the coupling effect between cells that are connected to the same word line and store even page data and odd page data.

FIG. 6A is a diagram showing an exemplary embodiment of a layout structure of a bit line selector circuit 120 illustrated in FIG. 5. Referring to FIG. 6A, the layout structure of the bit line selector circuit 120 has a structure where one switch is formed in one active region.

An active region 122e and a gate line GL<0> form high-voltage switch SW1 that transfers a bit line signal from latch LCH<x> in page buffer circuit 130 to bit line BLe<0> in response to select signal BLSe. Similarly, an active region 122o and a gate line GL<1> placed at a right side of a dummy bit line 112 form high-voltage switch SW5 that transfers a bit line signal from the latch LCH<x> in the page buffer circuit 130 to a bit line BLe<m-2> in response to a select signal BLSo.

According to the above-described manner of operation, high-voltage switch SW2 in FIG. 4 can be formed by an active region 123e and a gate line GL<2> and high-voltage switch SW6 can be formed by an active region 123o and a gate line GL<3>. And, high-voltage switches connected with bit lines through which even page data is transferred, are isolated through the dummy bit lines from high-voltage switches connected with bit lines through which odd page data is transferred. Thus, formed within the bit line selector circuit 120 are high-voltage switches for transferring bit line signals from a page buffer circuit 130 to an even page region 114 and an odd page region 115, respectively. While two high-voltage switches are formed at one active region in case of the prior art, one high-voltage switch is formed at one active region in case of the present embodiment.

Further, connection lines 121 provided for connecting high-voltage switches to bit lines of the respective even and odd page regions 114 and 115 are formed of conductive layers arranged in a row direction, in this embodiment. The conductive layers can be formed of metal lines, which can be formed below the bit lines. Bit line signals sequentially provided from the page buffer circuit 130 are divided and transferred to even and odd page regions 114 and 115 through the connection lines 121 formed of the above-described conductive layers (or, metal lines).

Figure 6B:
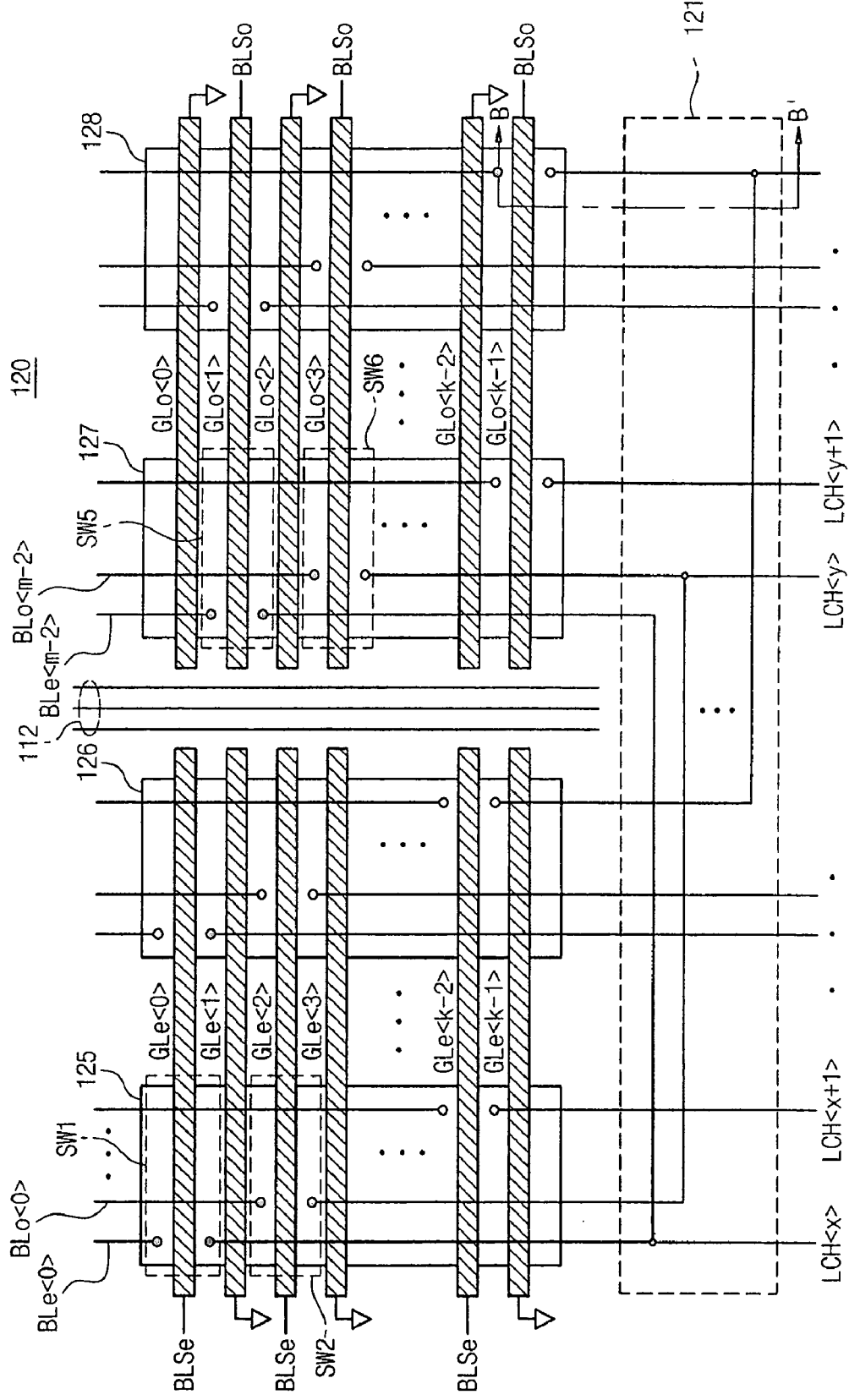
FIG. 6B is a diagram showing another embodiment of a layout structure for implementing the bit line selector circuit 120 illustrated in FIG. 5.

FIG. 6B is a diagram of another embodiment of a layout structure for implementing a bit line selector circuit 120 illustrated in FIG. 5. Referring to FIG. 6B, a layout structure according to this embodiment is illustrated to form bit line selector circuit 120. In accordance with this embodiment, a plurality of high-voltage switches is formed within one active region. In particular, unlike gate lines for high-voltage switches illustrated in FIG. 6A, gate lines GLe<0>-GLe<k-1> of high-voltage switches for transferring bit lines signals to an even page region are isolated from gate lines GLo<0>-GLo<k-1> of high-voltage switches for transferring bit lines signals to an odd page region, with dummy bit lines 112 being interposed therebetween. The dummy lines can be biased with a ground voltage. As a result, high-voltage switches for transferring bit lines signals to an even page region are isolated from high-voltage switches for transferring bit lines signals to an even page region.

Continuing to refer to FIG. 6B, formed on active regions 125 and 126 are gate lines GLe<0>, GLe<2>, ..., GLe<k-2> supplied with a bit line select signal BLSe configured to select even bit lines. Grounded gate lines GLe<1>, GLe<3>, ..., GLe<k-1>, which are effectively dummy gate lines, are formed between the gate lines GLe<0>, GLe<2>, ..., GLe<k-2>, respectively. The gate line GLe<0> and the active region 125 constitute high-voltage switch SW1, and the gate line GLe<2> and the active region 125 constitute high-voltage switch SW2.

Similarly, formed on active regions 127 and 128 are gate lines GLo<1>, GLo<3>, . . . , GLo<k-1> supplied with a bit line select signal BLSo configured to select odd bit lines. Grounded gate lines GLe<0>, GLe<2>, . . . , GLe<k-2>, which are effectively dummy gate lines, are formed between the gate lines GLo<1>, GLo<3>, . . . , GLo<k-1>, respectively. The gate line GLo<1> and the active region 127 constitute high-voltage switch SW5, and the gate line GLo<3> and the active region 127 constitute high-voltage switch SW6.

Together with the above-described high-voltage switches, there are formed connection lines 121 for sequentially transferring to an even page region 114 and an odd page region 115 bit line signals corresponding to even page data and odd page data from latches in a page buffer circuit 130 (shown in FIG. 5). The connection lines 121 between high-voltage switches (e.g., SW1 and SW5) are formed of conductive layers or metal layers that are formed in the parallel direction with a word line.

In accordance with the above-described layout structure of the bit line selector circuit 120, the coupling effect between regions is interrupted when programming even page data and odd page data. Although memory cells are connected to the same word line, memory cells for storing odd page data are sufficiently spaced apart from memory cells for storing even page data. Accordingly, it is possible to interrupt the coupling effect through a shield effect using dummy bit lines, e.g., dummy bit lines 112.

FIG. 7 is a block diagram showing a second embodiment of a flash memory device according to an aspect of the present invention. Referring to FIG. 7, a flash memory device 200 according to the second embodiment can have an operating characteristic to reduce the coupling effect of memory cells in the same word line by about 50% as compared with the prior part.

A cell array 210 has the same structure as that in FIG. 5. Only, program positions of even page data and odd page data are changed according to the architecture of a bit line selector circuit 220. According to the second embodiment of the present invention, two adjacent memory cells on a word line store even page data, while two adjacent memory cells on the same word line, which are placed adjacent to the memory cells for even page data, store odd page data. It is possible to reduce the coupling effect when programming even page data and odd page data through a structure where even and odd page data is in turn stored in two adjacent memory cells. The cell array 210 can be divided into even page regions 214e and 215e and odd page regions 214o and 215o in a string unit of two adjacent memory cells. But, this characteristic is a result of performing a program operation according to a bit line selector circuit 220 of the present invention, without the need for change of a design structure of the cell array 210.

The bit line selector circuit 220 is configured to alternately store even page data and odd page data in a cell unit of two memory cells, and comprises a plurality of high-voltage switches SW1-SW8. If bit line signals corresponding to even page data are transferred from latches LCH<0>-LCH<m-1> of a page buffer circuit 230, a controller circuit 240 activates a bit line select signal BLSe. At this time, the high-voltage switches SW1, SW2, SW5 and SW6 are turned on to transfer bit line signals to the even page regions 214e and 215e. This enables memory cells of the even page regions 214e and 215e in a selected word line to be programmed with corresponding states to bit line signals. On the other hand, if bit line signals corresponding to odd page data are transferred from the latches LCH<0>-LCH<m-1> of the page buffer circuit 230, the controller circuit 240 activates a bit line select signal BLSo. At this time, the high-voltage switches SW3, SW4, SW7 and SW8 are turned on to transfer bit line signals to the odd page regions 214o and 215o. This enables memory cells of the odd page regions 214o and 215o in the selected word line to be programmed with states corresponding to the bit line signals.

In a program operation, the page buffer circuit 230 sequentially provides even page data and odd page data to the bit line selector circuit 220 as bit line signals. At a read operation, the page buffer circuit 230 senses signals on selected bit lines through the bit line selector circuit 220 as data programmed in selected memory cells.

The controller circuit 240 controls the high-voltage switches SW1-SW8 in the bit line selector circuit 220 in response to a column address. When programming even page data, the controller circuit 240 activates the bit line select signal BLSe to turn on corresponding high-voltage switches. This enables the bit line signals to be transferred to even page regions. When programming odd page data, the controller circuit 240 activates the bit line select signal BLSo to turn on corresponding high-voltage switches. This enables the bit line signals to be transferred to odd page regions.

A row decoder circuit 250 selects a word line in response to a row address, and supplies the selected word line and unselected word lines with corresponding word line voltages. The constituent elements 230, 240, and 250 in FIG. 7 are substantially identical to those in FIG. 5, while the bit line selector circuit 220 is different in structure from that in FIG. 5.

Figure 8:
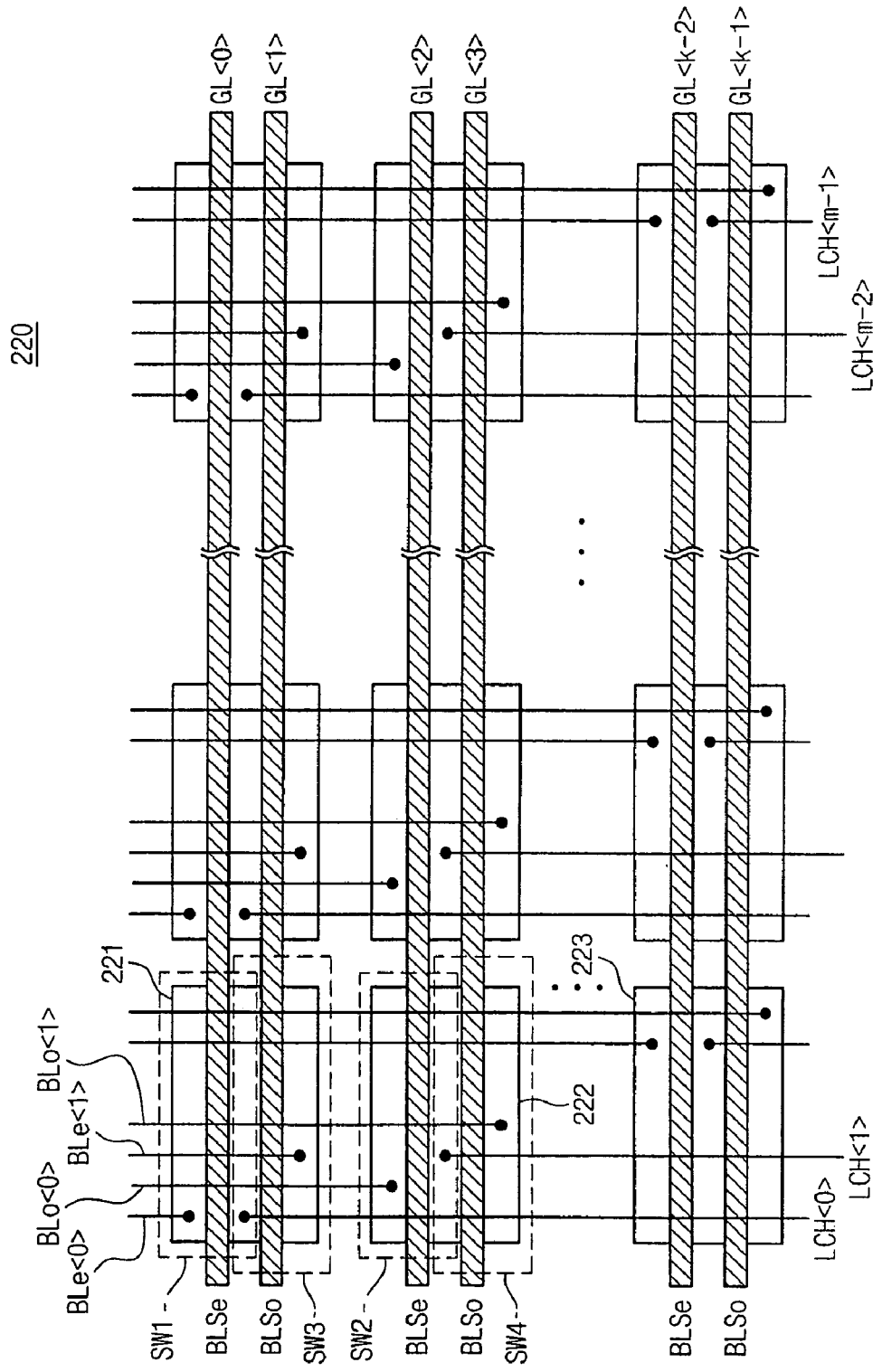
FIG. 8 is a diagram showing an embodiment of a layout structure of the bit line selector circuit illustrated in FIG. 7.

FIG. 8 is a diagram showing an embodiment of a layout structure of the bit line selector circuit 220 illustrated in FIG. 7.

As illustrated in FIG. 8, two gate lines are formed on one active region so that select signals BLSe and BLSo are sequentially transferred. Formed on an active region are a gate line BL<0> for transferring a select signal BLSe and a gate line BL<1> for transferring a select signal BLSo. Accordingly, formed on an active region 221 are two high-voltage switches SW1 and SW3 for sequentially providing even page data and odd page data in a latch LCH<0> to a bit line BLe<0> and a bit line BLe<1>. A gate line GL<2> for transferring the select signal BLSe and a gate line GL<3> for transferring the select signal BLSo are formed at an active region 222 to form two high-voltage switches SW2 and SW4.

In accordance with the layout structure of the second embodiment, it is possible to transfer even page data and odd page data to corresponding bit lines in respective regions without additional connection between high-voltage switches using a metal layer.

Figure 9:
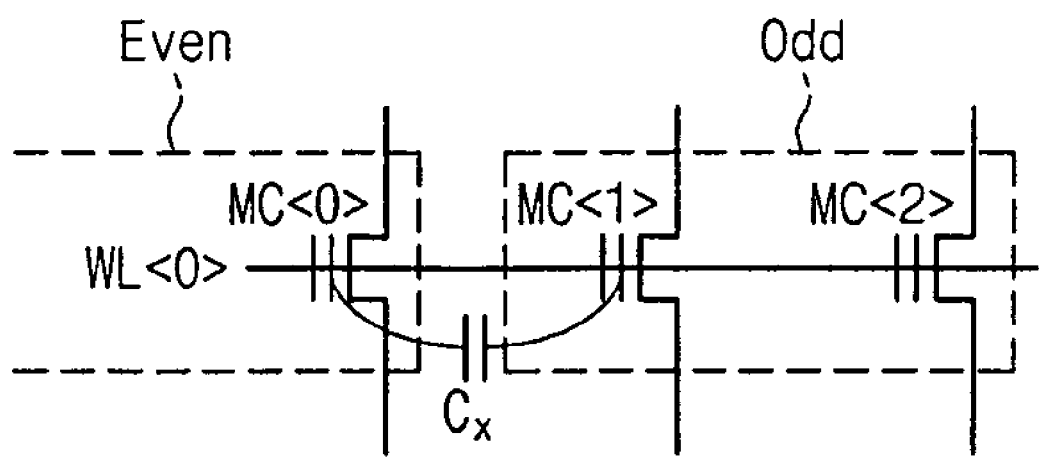
FIG. 9 is an embodiment of a circuit diagram for describing the coupling effect between memory cells of a flash memory device according to aspects of the present invention.

FIG. 9 is an embodiment of a circuit diagram for describing the coupling effect between memory cells of a flash memory device according to aspects of the present invention.

Referring to FIG. 9, while memory cells of an even page region including a memory cell MC<0> are programmed, a memory cell MC<1> suffers the coupling effect from the memory cell MC<0>. A memory cell MC2 does not suffer the coupling effect from the memory cell MC1 because the memory cell MC2 is placed at the same region (i.e., an odd page region) as the memory cell MC1. That is, a memory cell suffers the coupling effect from a memory cell that is placed in a different page region. While it can be difficult to perfectly remove the coupling effect, the coupling effect can be sufficiently mitigated to secure an acceptable margin of threshold voltage distributions, according to the second embodiment above.

Figure 10:
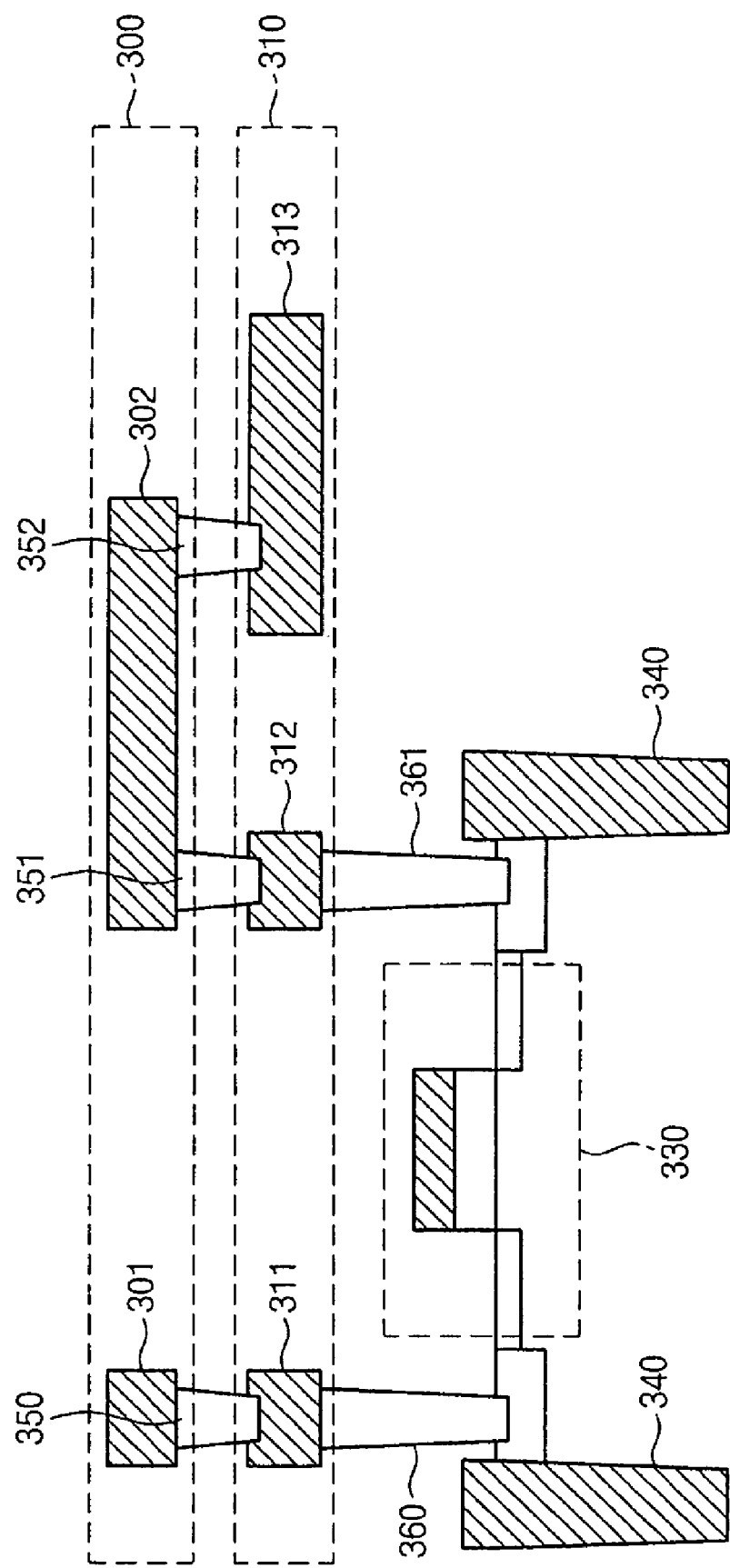
FIG. 10 is a diagram showing cross sections taken along dotted lines A-A' and B-B' in FIGS. 6A and 6B.

FIG. 10 is a diagram showing cross sections taken along dotted lines A-A' and B-B' in FIGS. 6A and 6B.

Referring to FIG. 10, a high-voltage switch 330 is formed between device isolation films 340. Metal layers 300 and 310 are formed to be connected to a source or drain of the high-voltage switch 330, and metal plugs are formed to connect each metal layer and the high-voltage switch 330. Metal lines (e.g., 121 in FIG. 5) for connecting the high-voltage switch 330 to another high-voltage switch corresponding to an even page are formed using the metal layer 310.

The metal layer 300 is a metal layer used to form bit lines. As illustrated in FIG. 10, the source or drain of the high-voltage switch 330 is connected through the contact plugs 351 and 361 to the metal layer 300, i.e., the metal layer on which bit lines are formed. The drain or source of high-voltage switch 330 is connect to metal layer 310 and metal layer 300 via contact plugs 311 and 301, respectively. A metal line 302 formed at one side of the high-voltage switch 330 is expanded to a page buffer side. The metal line 302 is connected through a contact plug 352 to a metal line 313 formed in a word line direction on the metal layer 310. The metal line 313 can be connected to another high-voltage switch in the same structure. As will be appreciated by one skilled in the art, the metal line 313 for connecting high-voltage switches is formed using a metal layer different from the metal layer 310.

In embodiments of a bit line selector circuit using the metal line 313 having the above-described structure, the coupling effect between memory cells can be interrupted without change of the surrounding circuits, e.g., a memory cell array.

As above described, it is possible to reduce a threshold voltage variation due to the coupling effect between adjacent memory cells. Accordingly, margin of threshold voltage distributions can be sufficiently maintained.

Although the present invention has been described in connection with the embodiment of the present invention illustrated in the accompanying drawings, it is not limited thereto. It will be apparent to those skilled in the art that various substitution, modifications and changes can be thereto without departing from the scope and spirit of the invention, and that they can be applied in numerous applications, only some of which have been described herein. It is intended by the following claims to claim that which is literally described and all equivalents thereto, including all modifications and variations that fall within the scope of each claim.

What is claimed is:

1. A flash memory device comprising:
   a word line;
   even page cells that are physically adjacent and connected to the word line in a first page region;
   odd page cells that are physically adjacent and connected to the word line in a second page region; and
   a bit line selector circuit configured to supply page data to either one of the even page cells or the odd page cells in a program operation,
   wherein the first page region and the second page region are isolated.

2. The flash memory device of claim 1, further comprising:
   a page buffer circuit configured to program the page data, wherein the bit line selector circuit is configured to supply the page data in the page buffer circuit to bit lines connected to the even page cells or to bit lines connected to the odd page cells.

3. The flash memory device of claim 2, wherein the page buffer circuit is further configured to apply a program inhibit voltage to the bit lines of an unselected one of the even page cells or the odd page cells, wherein unselected page cells are those page cells not being programmed with program data.

4. A flash memory device comprising:
   a cell array including an even page region having at least two adjacent memory cells connected to a word line and an odd page region having at least two adjacent memory cells connected to the word line;
   a page buffer circuit configured to supply page data to the cell array; and
   a bit line selector circuit disposed between the page buffer circuit and the cell array, and configured to transfer the page data to bit lines in either one of the even page region or the odd page region in a program operation,
   wherein the even page region and the odd page region are isolated.

5. The flash memory device of claim 4, wherein the bit line selector circuit is further configured to alternate the transfer of the page data between the even page region and the odd page region.

6. The flash memory device of claim 4, further comprising a controller circuit configured to generate a first select signal to select bit lines in the even page region or a second select signal to select the bit lines in the odd page region, in response to a column address.

7. The flash memory device of claim 4, wherein the bit line selector circuit comprises:
   a first switch configured to transfer the page data to bit lines connected to the even page region in response to the first select signal; and
   a second switch configured to transfer the page data to bit lines connected to the odd page region in response to the second select signal.

8. The flash memory device of claim 7, wherein the page buffer circuit is configured to provide a program inhibit voltage to bit lines connected to the odd page region in response to the first select signal and to bit lines connected to the even page region in response to the second select signal.

9. The flash memory device of claim 7, wherein the bit line selector circuit comprises:
   first and second even gate lines for transferring the first select signal;
   first and second odd gate lines for transferring the second select signal;
   a first active region formed at a lower side of the first even gate line, connected to a bit line of a first memory cell of the even page cells, and having a contact connected with an connection line from a first latch of the page buffer circuit;
   a second active region formed at a lower side of the second even gate line and connected with a bit line of a second memory cell adjacent to the first memory cell;
   a third active region formed at a lower side of the first odd gate line and connected with a bit line of a third memory cell of the odd page cells; and
   a fourth active region formed at a lower side of the second odd gate line, connected to a bit line of a fourth memory cell adjacent to the third memory cell, and having a contact connected with an connection line from a second latch of the page buffer circuit,
   wherein the connection line from the first latch is connected to the third active region and the connection line from the second latch is connected to the second active region.

10. The flash memory device of claim 9, wherein a connection between the connection line from the first latch and the third active region and a connection between the connection line from the second latch and the second active region are formed on different layers from the bit lines and in metal lines perpendicular to the bit lines.

11. The flash memory device of claim 9, wherein the first and second odd gate lines are in an alternating arrangement between the first and second even gate lines.

12. The flash memory device of claim 9, further comprising dummy bit lines formed between the first and second active regions and the third and fourth active regions, formed on an upper side of the gate lines, and biased with a ground voltage.

13. The flash memory device of claim 7, wherein the bit line selector circuit comprises:
  a first connection line from a first latch of the page buffer circuit;
  a second connection line from a second latch of the page buffer circuit;
  a first active region connected with the first connection line via a first contact, with the second connection line via a second contact, and with bit lines of first and second memory cells, placed adjacently to each other, in the even page region via third and fourth contacts;
  a second active region connected with the first connection line via a fifth contact, with the second connection line via a sixth contact, and with bit lines of first and second memory cells, placed adjacently to each other, in the odd page region via seventh and eighth contacts;
  first and second even gate lines formed between the first contact and the third contact and between the second contact and the fourth contact and formed on the first active region;
  first and second odd gate lines formed between the fifth contact and the seventh contact and between the sixth contact and the eighth contact and formed on the second active region; and
  a plurality of dummy gate lines formed on the first and second active regions, formed in turn between the first and second even gate lines and the first and second odd gate lines, and biased with a ground voltage.

14. The flash memory device of claim 13, further comprising dummy gate lines formed between the first active region and the second active region, and biased with a ground voltage.

15. The flash memory device of claim 13, further comprising metal lines formed between the first connection line and the fifth contact and between the second connection line and the second contact, and formed in a different layer from the bit lines and perpendicular to the bit lines.

16. The flash memory device of claim 4, further comprising dummy bit lines formed between the even page region and the odd page region and biased with a ground voltage.

17. The flash memory device of claim 4, wherein memory cells in the even and odd page regions are NAND flash memory cells.

18. A method of programming a flash memory device that comprises memory cells connected to a word line, the method comprising:
  storing page data in a page buffer circuit;
  supplying the page data to bit lines of even page cells that are physically adjacent or to bit lines of odd page cells that are physically adjacent in response to a column address; and
  applying a program voltage to the word line,
wherein a region being allocated the even page cells, and a region being allocated the odd page cells are isolated.

19. The method of claim 18, further comprising applying a program-inhibit voltage to bit lines of the even page cells or of the odd page cells, wherein unselected page cells are those page cells not being programmed with program data.

20. A method of programming a flash memory device that comprises memory cells connected to a word line, the method comprising:
  storing page data in a page buffer circuit;
  supplying the page data to an even page region having at least two memory cells that are physically adjacent or to an odd page region having at least two memory cells that are physically adjacent, in response to a column address; and
  applying a program voltage to the word line,
wherein the even page region and the odd page region are isolated.

21. The method of claim 20, further comprising applying a program-inhibit voltage to the bit lines connected to the even or odd page region to which no page data is supplied.

22. The method of claim 20, wherein the memory cells include a plurality of even page cells and a plurality of odd page cells that are alternately disposed.

23. A flash memory device comprising
  a cell array including an even page region having at least two adjacent memory cells connected to a word line and an odd page region having at least two adjacent memory cells connected to the word line;
  a page buffer circuit configured to supply page data to the cell array; and
  a bit line selector circuit disposed between the page buffer circuit and the cell array, and configured to transfer the page data to bit lines in either one of the even page region or the odd page region in a program operation,
  wherein the bit line selector circuit comprises a first switch configured to transfer the page data to bit lines connected to the even page region in response to the first select signal; and a second switch configured to transfer the page data to bit lines connected to the odd page region in response to the second select signal,
  wherein the bit line selector circuit comprises:
  first and second even gate lines for transferring the first select signal;
  first and second odd gate lines for transferring the second select signal;
  a first active region formed at a lower side of the first even gate line, connected to a bit line of a first memory cell of the even page cells, and having a contact connected with an connection line from a first latch of the page buffer circuit;
  a second active region formed at a lower side of the second even gate line and connected with a bit line of a second memory cell adjacent to the first memory cell;
  a third active region formed at a lower side of the first odd gate line and connected with a bit line of a third memory cell of the odd page cells; and
  a fourth active region formed at a lower side of the second odd gate line, connected to a bit line of a fourth memory cell adjacent to the third memory cell, and having a contact connected with an connection line from a second latch of the page buffer circuit,
  wherein the connection line from the first latch is connected to the third active region and the connection line from the second latch is connected to the second active region.

24. A bit line selector circuit of a flash memory device comprising:
  first and second even gate lines for transferring a first select signal;
  first and second odd gate lines for transferring a second select signal;

a first active region formed at a lower side of the first even gate line, connected to a bit line of a first memory cell of even page cells, and having a contact connected with an connection line from a first latch of a page buffer circuit;

a second active region formed at a lower side of the second even gate line and connected with a bit line of a second memory cell adjacent to the first memory cell;

a third active region formed at a lower side of the first odd gate line and connected with a bit line of a third memory cell of odd page cells; and a fourth active region formed at a lower side of the second odd gate line, connected to a bit line of a fourth memory cell adjacent to the third memory cell, and having a contact connected with an connection line from a second latch of the page buffer circuit, wherein the connection line from the first latch is connected to the third active region and the connection line from the second latch is connected to the second active region.

* * * * *